United States Patent [19]

Watanabe et al.

[11] Patent Number: 5,225,935
[45] Date of Patent: Jul. 6, 1993

[54] OPTICAL DEVICE HAVING A MICROLENS AND A PROCESS FOR MAKING MICROLENSES

[75] Inventors: Noriko Watanabe; Hiroshi Hamada, both of Nara; Fumiaki Funada, Yamatokoriyama, all of Japan

[73] Assignee: Sharp Kabushiki Kaisha, Osaka, Japan

[21] Appl. No.: 911,352

[22] Filed: Jul. 8, 1992

Related U.S. Application Data

[63] Continuation of Ser. No. 604,833, Oct. 26, 1990, abandoned.

[30] Foreign Application Priority Data

| Oct. 30, 1989 | [JP] | Japan | 1-283864 |
| Oct. 30, 1989 | [JP] | Japan | 1-283865 |
| May 28, 1990 | [JP] | Japan | 2-138084 |
| May 30, 1990 | [JP] | Japan | 2-142659 |

[51] Int. Cl.$^5$ ............ G02B 5/13; B29D 11/00
[52] U.S. Cl. .................... 359/619; 264/2.5; 264/2.7; 359/620
[58] Field of Search ............. 350/167; 264/1.6, 1.7, 264/1.4, 2.5, 2.7; 359/619, 620

[56] References Cited

U.S. PATENT DOCUMENTS

| 3,213,753 | 10/1965 | Rogers | 350/167 |
| 3,594,457 | 7/1971 | Wright | 350/167 |
| 3,653,747 | 4/1972 | Koeelnik | 350/167 |
| 3,827,783 | 8/1974 | Lemelson | 350/167 |
| 4,129,628 | 12/1978 | Tamutus | 359/620 |
| 4,200,794 | 4/1980 | Newberry et al. | 250/396 M |
| 4,414,316 | 11/1983 | Conley | 359/620 |
| 4,420,527 | 12/1983 | Conley | 359/620 |
| 4,498,736 | 2/1985 | Griffin | 350/167 |
| 4,634,220 | 1/1987 | Hockert et al. | 350/167 |
| 4,634,624 | 1/1987 | Tajima et al. | 428/212 |
| 4,645,301 | 2/1987 | Orensteen et al. | 350/167 |
| 4,667,092 | 5/1987 | Ishihara | 359/619 |
| 4,695,719 | 9/1987 | Wilmerding | 350/167 |
| 4,986,633 | 1/1991 | Ohta | 350/167 |

FOREIGN PATENT DOCUMENTS

| 0304709 | 3/1989 | European Pat. Off. |
| 55-073012 | 6/1980 | Japan |
| 61-058838 | 3/1986 | Japan |
| 61-220149 | 9/1986 | Japan |
| 1-257901 | 10/1989 | Japan |

OTHER PUBLICATIONS

Naemura, et al., Japanese Publication No. 60-165621.
Naemura, et al., Japanese Publication No. 60-165622.
Naemura, et al., Japanese Publication No. 60-165623.
Naemura et al., Japanese Publication No. 60-165624.
Hamada et al., Japanese Publication No. 60-262131.
Shimura et al., Japanese Publication No. 54-17620.
Yamashije et al., Japanese Publication No. 57-9180.
Mijagawa et al., Japanese Publication No. 63-44624.
Aizawa et al., Japanese Publication No. 1-167802(A).
Oikawa, M. "Distributed-Index Planar Microlens" *Applied Optics*, vol. 21, No. 6, Mar. 1982, pp. 1052-1056.
Oikawa, M. "Distributed-Index Planar Microlens Array prepared from Deep Electromigration", *Electronics Letters* vol. 17, No. 13, Jun. 25, 1981, pp. 452-454.
Suzuki, T. "New Fabrication Method of Plastic Microlens", 24th Micro-Optics Meeting pp. 20(118)-25(123).
Popovic, "Technique for Monolithic Fabrication of Microlens Arrays" *Applied Optics*, vol. 27, No. 7, Apr. 1, 1988, pp. 1281-1284.

*Primary Examiner*—Martin Lerner
*Attorney, Agent, or Firm*—Robert F. O'Connell

[57] ABSTRACT

An optical device having a lens substrate and a microlens portion formed thereon, wherein the microlens has its lens portion formed on the part of the optical device that has substantially the same coefficient of expansion as that of the lens substrate.

5 Claims, 4 Drawing Sheets

OPTICAL DEVICE HAVING A MICROLENS AND A PROCESS FOR MAKING MICROLENSES

This is a continuation of copending application Ser. No. 07/604,833 filed on Oct. 26, 1990 now abandoned.

BACKGROUND OF THE INVENTION

1. Field of the Invention

The present invention relates generally to the attachment of microlenses to an optical device, and to the production of microlenses to be attached to an optical device. More particularly, the present invention relates to an optical device having a microlens secured thereto, and to a process for producing microlenses for such use on a mass-production basis by use of a light-permissive die or stamper, hereinafter referred to as the "stamper".

2. Description of the Prior Art

In this specification, the "microlens" means a lens of a size of not larger than a few millimeters, and also means a group of such microlenses which are arranged one-dimensionally or two-dimensionally. Hereinafter, these two types are generally referred to as "microlens".

The microlens can be used for various uses, for example:

(1) To intensify luminance by focusing light in areas around picture elements in non-luminant display devices such as liquid crystal devices, as disclosed in Japanese Laid-Open Patent Publications Nos. 60-165621 to 165624, and No. 60-262131.

(2) As light pick-up means such as laser disc, compact discs, and optical magnetic disc.

(3) As a focusing means for coupling a luminant device or a receptive device to an optical fiber.

(4) As a focusing means or an image forming means for focusing an incident light in a photoelectric converting zone so as to increase the sensitivity of a primary image sensor used in a solid-state image devices such as a CCD or facsimile machines (Japanese Laid-Open Publications Nos. 54-17620 and 57-9180).

(5) As an image forming means for forming an image on a sensitive medium to be printed by a liquid crystal printer or an LED printer (Japanese Laid-Open Publication No. 63-44624, etc.).

(6) As a filter for treating photoinformation.

To make microlenses, the following processes are known:

(1) A substrate containing ions is submerged in a solution of alkaline salt, and ions are exchanged between the substrate and the salt solution through a mask formed on the substrate, thereby obtaining a substrate having a distribution of indexes of refraction corresponding to the pattern of the mask ("Ion Exchange Method" Applied Optics, 21(6), page 1052 (1984), Electron Lett., 17, page 452 (1981)).

(2) A photosensitive monomer is irradiated with ultra violet rays so as to polymerize an irradiated portion of the photosensitive monomer. Thus, the irradiated portion is caused to bulge into a lens configuration under an osmotic pressure occurring between the irradiated portion and the non-irradiated portion ("Process of Producing Plastic Microlenses"—24th Micro-Optics Meeting).

(3) A photosensitive resin is patterned into circles, and heated to temperatures above its softening point so as to enable the peripheral portion of each circular pattern to sag by surface tension, this process being referred to the "heat sagging process", ("Heat Sagging Process" by Zoran D. Popovic et al—Applied Optics, 27 page 1281 (1988)).

(4) A lens substrate is mechanically shaped into a lens (Mechanical Process).

A disadvantage common to these processes is that it requires several steps, therefore takes a relatively long time. As a result, they are not suitable for mass-production.

To achieve mass-production, an injection method employing a stamper made of metal such as nickel is proposed for molding plastic material into microlenses. However, the optical device having microlenses attached by this process has a disadvantage in that the microlenses are likely to separate from the optical device because of a difference in the coefficient of expansion, when the optical device is subjected to a rise in the ambient temperature.

There is another proposal for employing a stamper whereby a microlens is directly formed on an optical device. This process requires relatively high temperature and pressure. However, if such treatment is likely to damage the optical device that is normally liable to heat and pressure.

There is a further proposal for employing a metallic stamper that is applied to a photosensitive layer formed on the optical device so as to shape a lens configuration, and then the formed lens is allowed to harden under the irradiation of ultra violet rays. Under this process the ultra violet rays cannot be radiated from the side of the stamper but must be done from the side of the optical device. To effect the radiation of ultra violet rays through the optical device, the optical device should have a sufficient porosity to allow them to pass. These considerations restrict the selection of a material of which optical devices are made.

SUMMARY OF THE INVENTION

The optical device of this invention, which overcomes the above-discussed and numerous other disadvantages and deficiencies of the prior art, comprises having a lens substrate and a microlens portion formed thereon, wherein the microlens has its lens portion formed on the part of the optical device that has substantially the same coefficient of expansion as that of the lens substrate.

In a preferred embodiment, the lens portion is made of photosensitive resin.

In another preferred embodiment, the microlens is attached to the optical device with an adhesive layer whose index of refraction has a different value from that of the lens portion.

According to another aspect of the present invention, there is provided a process for producing microlens for use in combination with optical devices, the process comprising the steps of forming a photosensitive resin layer on the optical device, applying a light-permissive stamper to the photosensitive resin layer so as to shape the photosensitive layer into a lens portion, and curing the lens portion under the irradiation of ultra violet ray through the stamper.

Thus, the invention described herein makes possible the objectives of (1) providing an optical device adapted for mass-production; (2) providing an optical device in which a microlens is secured irrespective of any changes in temperatures and any shock; and (3)

providing a process for producing a microlens which enables microlenses to be directly formed on the optical device without damaging optical devices.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1A:
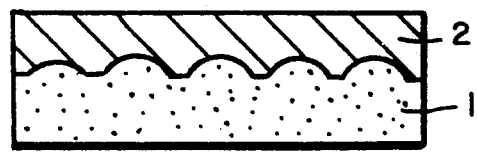
FIGS. 1A to 1E are vertical cross-sectional views illustrating a series of steps for producing a first example of the embodiment according to the invention.
Figure 1B:
Figure 1C:
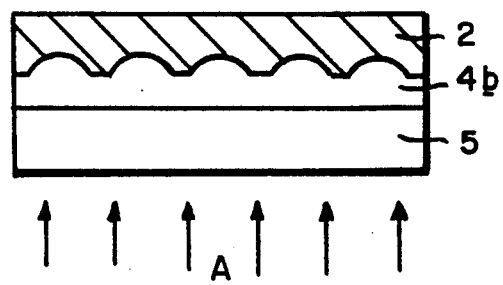
Figure 1D:
Figure 1E:
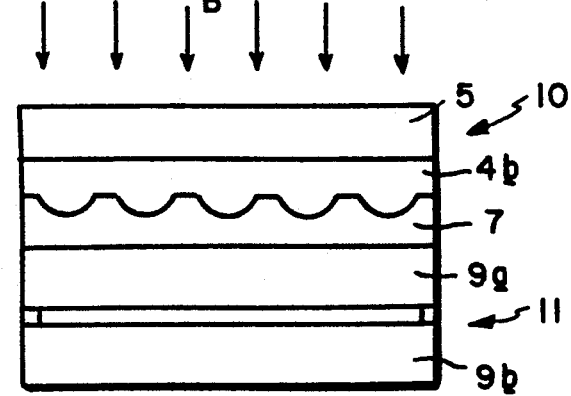

FIG. 1E shows the laminated structure of layers in a transmissive liquid crystal display apparatus 11, hereinafter referred to as "display apparatus", including a microlens 10. The microlens 10 includes a lens substrate 5 and a lens portion 4b formed of a first photosensitive resin on the lens substrate 5, and is bonded to a substrate 9a of the display apparatus 11 with a second photosensitive resin layer 7, that is, a bond layer. The substrates 9a and 9b are made of silica minerals such as silica glass. In the illustrated example, the substrate 5, which has virtually the same coefficient of expansion as that of the layers 9a and 9b, are made of the same kind of silica minerals such as silica glass.

A process for making a microlens according to the present invention will be described with reference to FIGS. 1A to 1E:

At the stage of FIG. 1A, a master 1 for the microlenses 10 was produced by a known heat sagging process, the microlens being a two-dimensional array which had a diameter of 38 μm, a radius of curvature of 72 μm, a central thickness of 3 μm, and an inter-lens distance of 42 μm. The microlens was designed so as to focuss light to each picture element (not shown) arranged in a matrix. Then, the master 1 was coated with metal such as Ni and Cu by electrotyping so as to produce a stamper 2.

At the stage of FIG. 1B, the first photosensitive layer 4a was formed about 100 μm thick on one of the sides of the substrate 5 of boro-silicate glass. This first photosensitive layer 4a was later shaped into a lens portion 4b as referred to below. The index of refraction of boro-silicate glass is 1.53, and therefore, as the first photosensitive resin, "NOA-61" manufactured by NORLAND Inc. (index of refraction is 1.56) was used because of the approximation in the index of refraction. Likewise, "AVR-100" and "TB-3003" manufactured by THREE-BOND Inc., "UV-1003" manufactured by SONY-CHEMICAL Inc., and "NOA-63" and "NOA-65" manufactured by NORLAND Inc. can be used as photosensitive resin.

At the stage of FIG. 1C, the stamper 2 was pressed against the photosensitive resin layer 4a under irradiation of ultra violet rays (wavelength: about 300 to 400 nm) so as to shape it into the lens portion 4b on the lens substrate 5. The ultra violet rays was radiated in the direction of arrows (A) toward the lens substrate 5.

At the stage of FIG. 1D the stamper 2 was released from the lens portion 4b. In this way a microlens 10 was obtained.

At the stage of FIG. 1E, the bond layer 7 (about 30 μm) was formed with a second photosensitive resin layer on the main substrate 9a of the display apparatus 11, and the microlens 10 was bonded to the substrate 9a by means of the layer 7.

As shown in FIG. 1E, the second photosensitive resin layer was irradiated with ultra violet rays (wavelength: about 300 to 400 nm) so as to harden the resin into the bond layer 7. The ultra violet rays were radiated in the direction of arrows (B) in FIG. 1E.

For the second photosensitive resin layer, "AVR-100" manufactured by THREEBOND Inc. which had a smaller index of refraction (i.e. 1.46) than that of the first photosensitive resin was used to form the bond layer 7, and the microlens 10 was bonded to the display apparatus 11 in such a manner that the lens portion 4b is faced thereto. Owing to the fact that the bond layer 7 was formed by the second photosensitive resin layer 7 having a smaller index of refraction than that of the first photosensitive resin, the lens portion 4b can function as a convex lens. If the two photosensitive resins had the same index of refraction, the microlens 10 would not function as a lens.

Figure 2A:
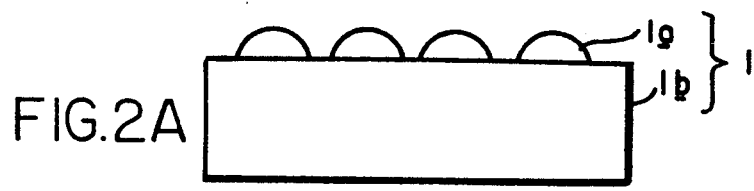
FIGS. 2A to 2E are vertical cross-sectional views illustrating a series of steps for producing a second example of the embodiment according to the invention.
Figure 2B:
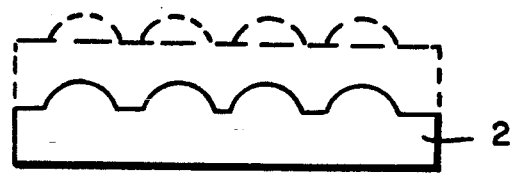
Figure 2C:
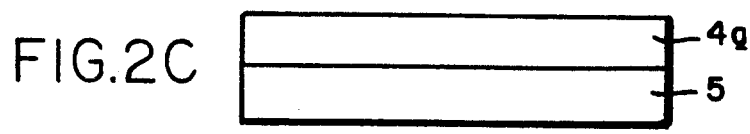
Figure 2D:
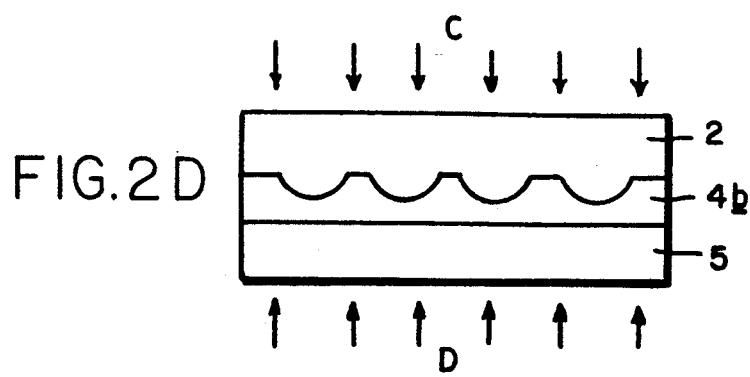
Figure 2E:
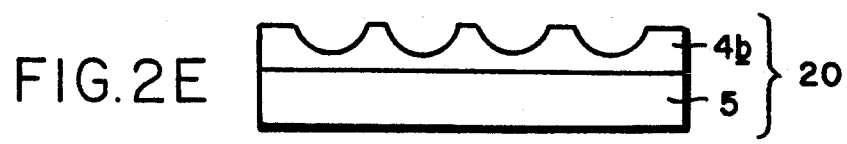

Referring to FIGS. 2A to 2E, a second example of the embodiment will be described:

As shown in FIG. 2E, a microlens 20 used herein is formed by forming a concave lens portion 4b on the substrate 5 made of boro-silicate glass of which the substrates 9a and 9b are also made.

A process of making the microlens 20 will be described:

At the stage of FIG. 2A, a microlens portion 1a is formed on a quartz glass substrate 1b so as to form a master 1 for the microlens 20. For a material for the microlens photoresist manufactured by a known heat sagging process can be used.

At the stage of FIG. 2B the top portions of the microlens portion 1a and the quartz glass substrate 1b were eroded by a dry etching with a gaseous mixture of carbon tetrafluoride and oxygen.

The etching conditions such as the flow rate, the pressure and the mixing ratio (partial pressure ratio) of the gaseous mixture, the RF power and the temperatures of the substrate were adjusted to respective optimum values, thereby ensuring that the lens portion 1a and substrate 1b are uniformly etched. In this example, the microlens portion 1a and the quartz glass 1b were etched from the respective tops by a greater thickness than the microlens portion 1a under such conditions that the ratios to be selected become equal to each other. Then, the configuration of the microlens 1a was transferred to the quartz substrate 1b. In this way a convex stamper 2 was obtained.

The stamper 2 can be used as a convex microlens or may be used as a master for making a concave microlens.

At the stage of FIG. 2c, a first photosensitive resin layer 4a on a substrate 5 of boro-silicate glass which is the same material for the substrate 9a and 9b used in the display apparatus 11. Then, the sequence advances to the next step of FIG. 2D, where the convex stamper 2 was applied to the first photosensitive resin layer 4a irradiated with ultra violet rays was shaped and cured, thereby forming a convex lens portion 4b on a glass substrate 5. Ultra violet ray can be radiated in either direction of arrow (C) or (D). At the stage of FIG. 2E the stamper 2 was removed from the lens portion 4b, thus obtaining a concave microlens 20.

The microlens 20 is attached to the display apparatus 11 by forming a bond layer 7 (second photosensitive layer) on the substrate 9a and radiating ultra violet rays upon the bond layer 7 so as to secure light-curing. The microlens 20 functions as a convex lens but if it is intended to enable the microlens 20 to function as a convex lens, the second photosensitive resin should have a larger index of refraction than that of the first photosensitive resin. In the illustrated embodiment, "AVR-100" (index of refraction: 1.46) manufactured by THREE-BOND Inc. was used for the first photosensitive resin, and "NOA-61" (index of refraction: 1.56) manufactured by NORLAND Inc. was used for the second photosensitive resin.

In the illustrated embodiments the microlens 10 and 20 were attached to the display apparatus 11 in such a manner that the lens portions 4b were in contact with the bond layer 7, thereby shortening the intervals between the picture elements in the display apparatus 11 and the lens portion 4b of the microlens 10 and 20. The shortened interval between the picture elements and the lens portion 4b allows the focal distance to be short, thereby ensuring that light is focused within the picture elements.

In the first example described above, the bond layer 7 was about 30 μm thick, and the substrate 9a was 1.1 mm thick. In order to focus light within the picture elements in the display apparatus 11, the microlens 10 is designed to ensure that the focal length f should be 1.1 mm in the glass substrate. In this case, the thickness of the bond layer 7 is much smaller than that of the substrate 9a, and therefore, the focal length f is expressed by the following equation (1):

$$f = r \cdot n3/(n1-n2) \quad (1)$$

where
r: the radius of curvature of the microlens 10
n 1: the index of refraction of the lens portion 4b (1st photosensitive resign)
n 2: the index of refraction of the bond layer 7 (2nd photosensitive resin layer)
n 3: the index of refraction of the substrate 9a The value of the equation (1) is obtained by multiplying. The theorem (2) by a coefficient (n 3/n 2) which is used to convert the focal length f1 into a focal length in the medium 3 (index of refraction: n 3):

$$f1 = r \cdot n2/(n1-n2) \quad (2)$$

The theorem (2) is to obtain the focal length f1 in the interface between medium 1 (index of refraction: n 1) and medium 2 (index of refraction: n 2).

The following values are placed in the equation (1):
n1=1.56
n2=1.46
n3=1.53
r=72 μm (radius of curvature of the microlens 10
Thus, the focal length=1.1 mm It will be appreciated from this calculation that the light is focused on the picture elements in the display apparatus 11 through the microlens 10, the bond layer 7 and the substrate 9a.

In the illustrated embodiments, the substrates 5 of the microlenses 10 and 20 are made of boro-silicate glass as the substrate 9a of the display apparatus 11 is. The microlens 10 and 20 are respectively bonded to the substrate 9a of the display apparatus 11 through the bond layer 7 having a different index of refraction from that of the lens portion 4b. The lens portion 4b is formed on the substrate 5 by pressing a photosensitive resin layer 4a overlaying the substrate 5 by the stamper 2 under the irradiation of ultra violet rays. The following advantages result:

(1) The lens portion 4b of the microlenses 10 and 20 are formed on the substrate 5 made of the same material as that of the substrate 9a of the display apparatus 11, which means that they have the same coefficient of expansion, thereby preventing any detrimental separation from occurring between the microlens 10, 20 and the substrate 9a in response to changes in the ambient temperature. Since the lens portion 4b is made of the same material as that of the bond layer 7, they are sufficiently affiliated, thereby securing the bond between the microlenses 10, 20 and the substrate 9a.

(2) Since the bond layer 7 has a different index of refraction from that of the lens portion 4b, whereby the microlenses 10 and 20 are respectively bonded to the substrate 9a of the display apparatus 11, the microlenses 10 and 20 can function without being affected by the fact that the lens portion 4b is bonded to the substrate 9a of the display apparatus 11. This effect allows the lens portion 4b to be disposed in opposition to the substrate 9a, thereby shortening the focal length of the microlenses 10 and 20. Thus, the focusing strength of the lenses 10 and 20 is enhanced.

(3) The light is focused on the picture elements in the display apparatus 11, thereby increasing the effective porosity of the display apparatus 11. This enhances the luminance of the display apparatus 11, thereby securing clear image pictures on the screen.

(4) The use of the stamper 2 shortens the time required for shaping the microlens 10 and 20, thereby increasing the mass-productivity and decreasing the production cost.

(5) The lens portion 4a is formed by shaping a softened photosensitive layer 4a by use of the stamper 2, and after hardening, the shaped lens portion 4b is readily released from the stamper 2 preferably with the use of a lubricant.

The application of the optical device equipped with a microlens according to the present invention is not limited to the display apparatus 11, but can be made to any other optical apparatus, provided that the substrates of the microlenses 10 and 20 are respectively made of a material having the same coefficient of expansion as that of the object to which the microlenses 10 and 20 are bonded.

Referring to FIGS. 3A to 3G, a third example will be described:

In this example, a microlens 30 was directly bonded to a display apparatus 33 of a light transmission type.

Figure 3A:
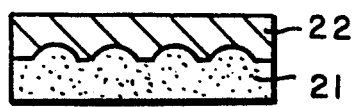
FIGS. 3A to 3G are vertical cross-sectional views illustrating a series of steps for producing a third example of the embodiment according to the invention.

A mold 21 was made by a conventional heat sagging process, from which a stamper 26 was made. The process will be more specifically described:

At the stage of FIG. 3A, the mold 21 is coated with metal such as copper or nickel by electrotyping, so as to obtain a master 22. The master 22 can be mechanically produced of metal.

Figure 3E:
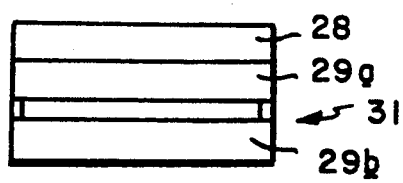
Figure 3B:

At the stage of FIG. 3B, the master 22 is coated with metal such as nickel or copper by electrotyping. In this way a mother 23 was obtained.

Then, a photosensitive layer 24 (about 100 μm thick) was formed on one side of the boro-silicate glass substrate 25, of which the substrates 29a and 29b were also made.

Figure 3F:
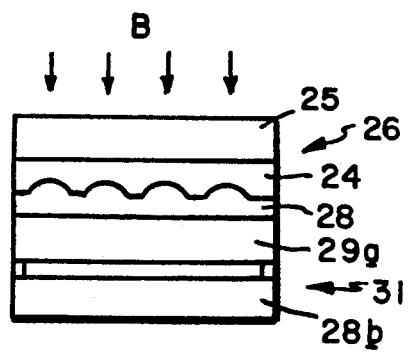
Figure 3C:
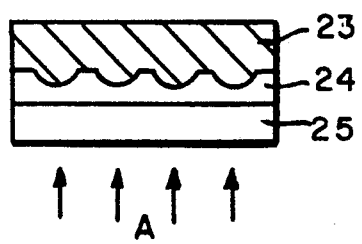

At the stage of FIG. 3C, the mother 23 was applied to the photosensitive resin layer 24 under the irradiation of ultra violet rays (wavelength: about 300 to 400 nm). Thus, the photosensitive resin layer 24 was formed and cured. The ultra violet rays was radiated in the direction of arrows (A) through the glass substrate 25 which allows the ultra violet rays to pass.

Figure 3G:
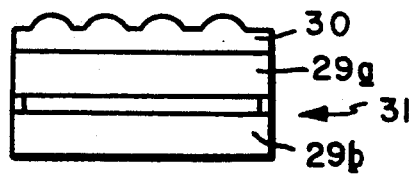
Figure 3D:
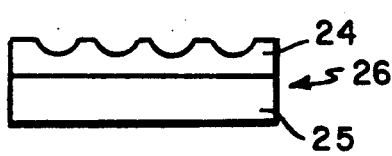

At the stage of FIG. 3D, the mother 23 was removed from the photosensitive layer 24. In this way the stamper 26 was obtained. Since the stamper 26 was composed of the hardened photosensitive resin layer 24 and boro-silicate glass substrate 25, it allows ultra violet rays to pass.

The stamper 26 can be made by other methods. For example, photosensitive resin can be poured into the mother 23 without the use of the boro-silicate glass substrate 25 under the irradiation of ultra violet rays so as to make it hard. Alternatively, instead of using the photosensitive resin layer 24, a resin layer can be formed on the boro-silicate glass substrate 25, wherein the resin material can be any kind if it is capable of hardening at a room temperature, and allows ultra violet ray to pass after becoming hardened, and the mother 23 can be applied thereto to obtain the stamper 26. Another alternative method is to inject a light-permissive substance such as polystyrene, acrylic resin, polyvinyle chloride, polycarbonate and glass, and mold it into the stamper 26 by use of an extruding machine.

Figure 4A:
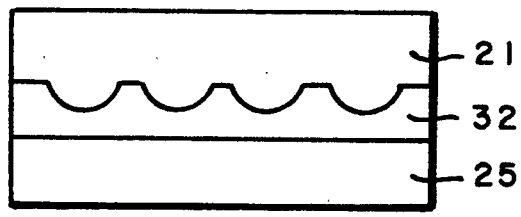
FIGS. 4A to 4C are vertical cross-sectional views illustrating a process for shaping a stamper by a known sol-gel method.
Figure 4B:
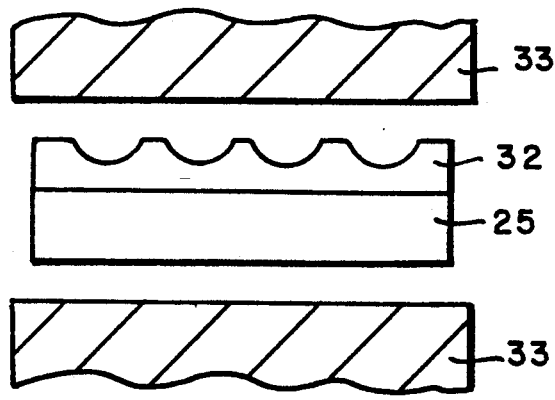
Figure 4C:
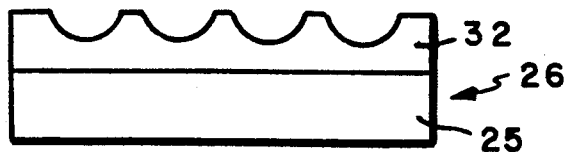

The stamper 26 can be also made by a sol-gel method. The advantage of this method is that a clear stamper 26 can be obtained directly from the master 21. Referring to FIGS. 4A to 4C, the sol-gel method will be described:

At the stage of FIG. 4A, a sol 32 of metallic alkoxide was obtained by adding water, ethyl alcohol, and a catalysis to ethyl silicate with the addition of polyethylene glycol whereby the sol becomes soft, and the sol 32 was coated on the glass substrate 25. At the stage of FIG. 4A, while the sol 32 was soft, the master 21 was applied to the sol 32 so as to shape it into a lens portion.

. At the stage of FIG. 4B, the lens portion was treated at not higher than 500° C. in a furnace 33. In this way the stamper 26 was obtained at the stage of FIG. 4C.

The sol-gel method includes the process of heat treatment, and the injection molding method also includes the process of heating at which the material is molten and molded. It is required to design the master 21 previously by taking into consideration a dimensional difference likely to occur when the stamper 26 cools to room temperature.

After the stamper 26 was obtained, a photosensitive layer 28 was formed about 100 μm thick on the substrates 29a or 29b of the display panel 31 at the stage of FIG. 3E. The photosensitive resin having an index of refraction near to that (i.e. 1.53) of boromanufactured by NORLAND Inc. having an index of refraction of 1.56 was used. It has been found that "AVR-100" and "TB-3003" manufactured by THREEBOND Inc., "UV-1003" manufactured by SONYCHEMICAL Inc., and "NOA-63" and "NOA-65" manufactured by NORLAND Inc. could be effectively used.

At the stage of FIG. 3F, the stamper 26 was applied to the photosensitive resin layer 28 so as to shape it into the microlens 30, which was then irradiated with ultra violet rays (wavelength: about 300 to 400 nm) through the stamper 26, thereby curing the photosensitive resin layer 28. The ultra violet rays were radiated in the direction of arrows (B) (FIG. 3F) through the stamper 26.

The stamper 26 was removed. In this way the microlens 30 was shaped as shown in FIG. 3G. Preferably, a silicon-base lubricant is coated on the inner surface of the stamper 26 before the stamper 26 is applied to the photosensitive resin layer 28 so as to enable the stamper 26 to be easily removed from the photosensitive resin layer 28.

The third example has the following advantages:
(1) The use of the stamper 26 shortens the time required for shaping the microlens 30, thereby increasing the mass-productivity and decreasing the production cost.
(2) Owing to the direct bond of the microlens 30 to the substrate 29a of the display panel 31, the bond between the microlens 30 and the substrate 29a is accordingly secured.
(3) The process of shaping the microlens 30 includes no process of applying heat or pressure, thereby making it possible to form the microlens 30 on the display panel 31 without the possibility of damaging the display apparatus 31 by heat.
(4) Ultra violet ray can be radiated through the stamper 26 from the side of the display panel 31 because it is made of a material allowing light to pass. If a conventional stamper made of a non-transparent material is used, ultra violet rays must be radiated through the display panel 31. When the black matrices are disposed in the display panel 31 so as to shield light against between the picture elements, the amount of ultra violet light passing therethrough is accordingly reduced. To compensate for the loss of ultra violet ray, the irradiation of it must be strengthened and prolonged to cure the photosensitive resin layer 28 sufficiently. If an excessively strong ultra violet ray is radiated through the display panel 31, the liquid crystal therein is likely to be degraded. The present invention has solved these problems.
(5) The light is focused on the picture elements in the display panel 31, thereby increasing the effective porosity of the display panel 31. This enhances the luminance of the display panel 31, thereby securing clear image pictures on the screen.

In the third example, the microlens (microlens array) having a focal length of 1.1 mm, and a diameter of about 90 μm was formed on the display panel 31 but its dimension can be variously changed in accordance with the size of the display panel.

The microlens can be applied to any other optical apparatus in addition to the liquid crystal display panel.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In an optical device having a main substrate and a microlens formed thereon, wherein the microlens has a lens portion integrally formed on a lens substrate, said microlens being formed on said main substrate through a stamped adhesive layer and said main substrate having substantially the same coefficient of expansion as that of the lens substrate.

2. An optical device according to claim 1, wherein the lens portion is made of photosensitive resin.

3. An optical device according to claims 1 or 2, wherein the stamped adhesive layer has a different index of refraction from that of the lens portion to shorten the focal length of the microlens.

4. An optical device according to claim 1, wherein the lens portion has substantially the same coefficient of expansion as that of the adhesive.

5. A process for producing a microlens, for use in combination with optical devices, the process comprising the steps of forming a photosensitive resin layer on a lens substrate, applying a light-permissive stamper to the photosensitive resin layer so as to shape the photosensitive layer into a lens portion, and curing the lens portion under the irradiation of ultra violet rays through the stamper, the stamper being shaped by a metal mother with photosensitive resin.

* * * * *